United States Patent [19]
Shiraishi et al.

[11] Patent Number: 5,995,329
[45] Date of Patent: *Nov. 30, 1999

[54] HARD MAGNETIC DISC UNIT HAVING HEAD GIMBAL ASSEMBLIES

[75] Inventors: Masashi Shiraishi; Noboru Yamanaka, both of Saku, Japan

[73] Assignee: TDK Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/070,981

[22] Filed: May 1, 1998

Related U.S. Application Data

[62] Division of application No. 08/828,414, Mar. 28, 1997, abandoned.

[30] Foreign Application Priority Data

Apr. 9, 1996 [JP] Japan ................................. 8-111102

[51] Int. Cl.⁶ ........................................................ G11B 5/48
[52] U.S. Cl. .................................................................. 360/104
[58] Field of Search ....................................... 360/104, 103

[56] References Cited

U.S. PATENT DOCUMENTS

| | | | |
|---|---|---|---|
| 5,781,379 | 7/1998 | Erpelding et al. | 360/104 |
| 5,796,552 | 8/1998 | Akin, Jr. et al. | 360/104 |
| 5,805,382 | 9/1998 | Lee et al. | 360/104 |

Primary Examiner—George J. Letscher
Attorney, Agent, or Firm—Collard & Roe, P.C.

[57] ABSTRACT

A hard magnetic disc unit having a plurality of head gimbal assemblies. Each head gimbal assembly has a magnetic head slider, a metal suspension for supporting the magnetic head slider, and insulating material layer formed on the metal suspension, and a conductive pattern of lead lines electrically connected with the magnetic head. The conductive pattern is formed on the insulating material layer. There are arm portions for supporting the respective head gimbal assemblies and an actuator for moving the arm portions to position the magnetic head sliders. There are also a plurality of resistors having a high resistance value for discharging electrostatic charge. The head gimbal assemblies are electrically insulated from a ground, and the resistors are connected between the head gimbal assemblies and the ground, respectively.

4 Claims, 7 Drawing Sheets

HARD MAGNETIC DISC UNIT HAVING HEAD GIMBAL ASSEMBLIES

This is a divisional application Ser. No. 08/828,414 filed on Mar. 28, 1997, abandoned.

FIELD OF THE INVENTION

The present invention relates to a head gimbal assembly (HGA) and a hard magnetic disk unit provided with the HGA used in a magnetic disk storage or in a magneto-optical disk storage.

DESCRIPTION OF THE RELATED ART

A HGA with a metal suspension on which a pattern of lead lines connected to a magnetic head are formed is known from, for example, Ohe et al. (Japanese Patent Unexamined Publication No. 6-215513) and Erpelding et al. (U.S. Pat. No. 4,996,623).

Ohe et al. discloses forming of a pattern of lead lines for connections with a magnetic head on a load beam by using photolithography, whereas Erpelding et al. discloses a laminated suspension provided with a flexible plastic material sheet, a stainless steel layer bonded to one side of the sheet and a copper layer having a pattern of lead lines for electrical connections and bonded to the other side of the sheet.

In both of these known arts, the lead lines for connections with the magnetic head are formed on an insulating material layer laminated on a base metal layer. As a result, a capacitor may be presented between the lead lines and the base metal layer. Since the base metal layer will be grounded, a parasitic capacitance $C_G$ will appear between the lead pattern and the ground. This parasitic capacitance $C_G$ will incorporate with a parasitic inductance produced by the lead lines and with an inductance component of the magnetic head, and thus will cause resonance near the data transmission frequency.

FIGS. 1 and 2 show equivalent circuits of a writing head part and a reading head part of a prior art HGA provided with an integrated read/write magnetic head, respectively. In these figures, reference numeral 10 denotes an equivalent circuit of an inductive type writing head, 11 denotes an equivalent circuit of lead lines for the writing head, 20 denotes an equivalent circuit of a magnetoresistive (MR) type reading head and 21 denotes an equivalent circuit of lead lines for the reading head.

In FIG. 1, a writing resonance frequency $f_0$ is given by;

$$f_0 = 1/2\pi\sqrt{(LC)}$$
$$\cong 1/2\pi\sqrt{\{(L_H + L_L)C_G\}}$$
$$\cong 76 \text{MHz},$$

where the parasitic capacitance $C_G$ is 40 pF, the parasitic inductance of the lead pattern $L_L$ is 20 nH, the inductance component of the inductive type writing head $L_H$ is 90 nH, $L=L_H+L_L$, and $C=C_G$ ($C_G>>C_L$, $C_L$ is a parasitic capacitance between the lead lines). Namely, due to the parasitic capacitance $C_G$, the writing head part will resonate at a frequency of about 76 MHz and thus no writing data with a frequency higher than this resonance frequency can be transmitted.

Similar to this, in FIG. 2, a reading resonance frequency $f_0$ is given by;

$$f_0 = 1/2\pi\sqrt{(LC)}$$
$$\cong 1/2\pi\sqrt{\{(l_P + L_L)C_G\}}$$
$$\cong 116 \text{MHz},$$

where the parasitic capacitance $C_G$ is 40 pF, the parasitic inductance of the lead pattern $L_L$ 20 nH, the inductance component of the MR type reading head $l_P$ is 30 nH, $L=l_P+L_L$, and $C=C_G$ ($C_G>>C_L$, $C_L$ is a parasitic capacitance between the lead lines). Namely, due to the parasitic capacitance $C_G$, the reading head part will resonate at a frequency of about 116 MHz and thus no reading data with a frequency higher than this resonance frequency can be transmitted.

SUMMARY OF THE INVENTION

It is therefore an object of the present invention to provide a HGA and a hard magnetic disk unit provided with the HGA, whereby a possible parasitic capacitance between lead lines and the ground can be reduced to shift the resonance point to a higher frequency resulting high speed data transmission for writing and reading to make possible.

The present invention relates to a HGA having a magnetic head slider, a metal suspension for supporting the magnetic head slider, an insulating material layer formed on the metal suspension, and a conductive pattern of lead lines electrically connected with the magnetic head. The conductive pattern is formed on the insulating material layer. Particularly, according to the present invention, a part of the metal suspension under the conductive pattern is removed. Therefore, parasitic capacitance $C_G$ between the conductive pattern and the metal suspension can be reduced.

The capacitance C of a capacitor is in general determined from $C=\epsilon_0 S/d$, where $\epsilon_0$ is a relative dielectric constant of the insulating material layer between opposed capacitor's electrodes, S is a facing area of the opposed electrodes and d is a distance between the electrodes. The parasitic capacitance $C_G$ can be reduced therefore by:

(1) increasing the distance d between the metal suspension and the conductive pattern;

(2) decreasing the relative dielectric constant $\epsilon_0$ of the insulating material layer between the metal suspension and the conductive pattern; and/or (3) decreasing the facing area S of the metal suspension and the conductive pattern.

However, if the thickness of the insulating material is increased to increase the distance d as described at (1), flexibility of the suspension will be mostly lost. Furthermore, decreasing of the relative dielectric constant $\epsilon_0$ as described at (2) is difficult because there is few insulating material having a relative dielectric constant lower than that of polyimide now used ($\epsilon_0=3.3$) and having good layer insulation characteristics. Therefore, according to the present invention, a part of the metal suspension under the conductive pattern is removed to decrease the facing area S as described at (3) and thus to reduce the parasitic capacitance $C_G$ between the conductive pattern and the metal suspension.

The facing area S can be in fact reduced by narrowing the width of the conductive pattern of lead lines. However, in this case, electrical resistance for direct current will be increased causing signal transmission characteristics to deteriorate. This increasing of the resistance can be prevented by increasing the thickness of the conductive pattern depending upon the narrowing of the width. However, in the latter case, not only it is very difficult to produce the narrow and thick conductive pattern but also the suspension with the produced narrow and thick conductive pattern will not have flexibility.

Reduced parasitic capacitance $C_G$ between the conductive pattern and the grounded metal suspension will shift the resonance frequency to a higher frequency resulting high speed data transmission for writing and reading to make possible. Furthermore, removing of a part of the metal suspension will reduce the weight of the metal suspension itself resulting the mechanical resonance characteristics and also the dynamic oscillation characteristics of the whole metal suspension to improve.

It is preferred that the metal suspension includes a metal load beam, and a metal flexure fixed on the metal load beam, the conductive pattern being formed on the flexure, and that a part of the metal flexure under the conductive pattern is removed. In this case, preferably, a part of the metal load beam under the conductive pattern is also removed.

In an embodiment of the present invention, a plurality of via holes may be formed through the metal flexure. In a modification, a plurality of via holes may be also formed through the metal load beam.

According to the present invention, a plurality of recesses are formed on the metal suspension under the conductive pattern. By forming these recesses on the metal suspension, not only the distance d between the metal suspension and the conductive pattern is increased but also the facing area S is decreased resulting in the parasitic capacitance $C_G$ between the conductive pattern and the metal suspension being reduced.

Reduced parasitic capacitance $C_G$ between the conductive pattern and the grounded metal suspension will shift the resonance frequency to a higher frequency resulting high speed data transmission for writing and reading to make possible. Furthermore, forming of the recesses on the metal suspension will reduce the weight of the metal suspension itself resulting the mechanical resonance characteristics and also the dynamic oscillation characteristics of the whole metal suspension to improve.

It is preferred that the metal suspension includes a metal load beam and a metal flexure fixed on the metal load beam, on which flexure the conductive pattern is formed, and that a plurality of recesses are formed on the metal flexure under the conductive pattern.

According to the present invention, furthermore, at least a part of the metal suspension under the conductive pattern is formed in a mesh structure. By forming the metal suspension in a mesh structure, the practical facing area S of the metal suspension and the conductive pattern is decreased resulting the parasitic capacitance $C_G$ between the conductive pattern and the metal suspension to reduce.

Reduced parasitic capacitance $C_G$ between the conductive pattern and the grounded metal suspension will shift the resonance frequency to a higher frequency resulting high speed data transmission for writing and reading to make possible. Furthermore, the mesh structure of the metal suspension will reduce the weight of the metal suspension itself resulting the mechanical resonance characteristics and also the dynamic oscillation characteristics of the whole metal suspension to improve.

Also, the present invention relates to a hard magnetic disk unit provided with a plurality of HGAs each of which has a magnetic head slider, a metal suspension for supporting the magnetic head slider, an insulating material layer formed on the metal suspension, and a conductive pattern of lead lines electrically connected with the magnetic head and formed on the insulating material layer, arm portions for supporting the respective HGAs, an actuator for moving the arm portions to position the magnetic head sliders, and a grounded housing of the hard magnetic disk unit. Particularly, according to the present invention, the HGAs are electrically insulated from the grounded housing. Since the HGAs are insulated for direct current from the grounded housing, the effective parasitic capacitance $C_G'$ between the lead lines and the ground will extremely lower. Thus, the resonance frequency is shifted to a higher frequency resulting high speed data transmission for writing and reading to make possible.

As for the insulating structure between the HGAs and the grounded housing, the arm portions may be made of nonconductive material, coupling parts between the arm portions and the actuator are made of nonconductive material, or members made of nonconductive material are inserted between the HGAs and the arm portions.

It is preferred that resistors having a high resistance value for discharging electrostatic charge are connected across the HGAs and the grounded housing, respectively.

Further objects and advantages of the present invention will be apparent from the following description of the preferred embodiments of the invention as illustrated in the accompanying drawings.

DESCRIPTION OF THE PREFERRED EMBODIMENTS

Figure 1:
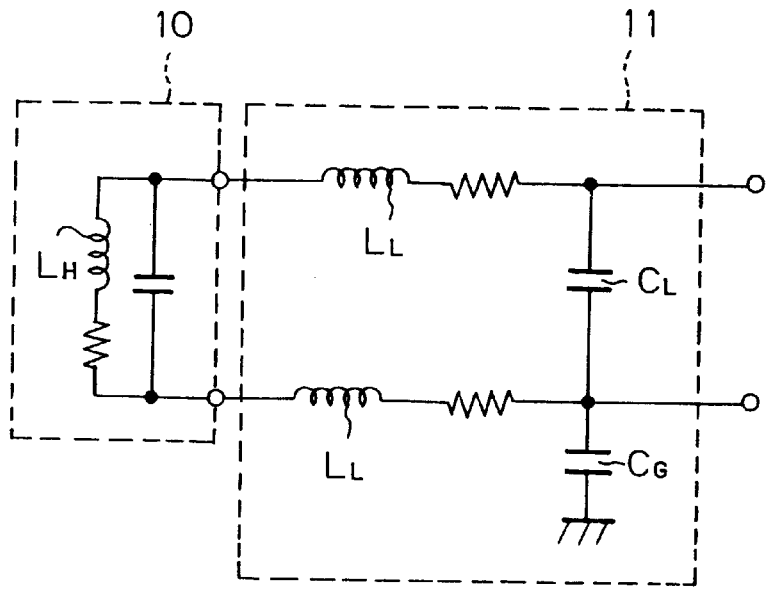
FIG. 1 shows the already described equivalent circuit of the writing head part of the prior art HGA provided with the integrated read/write magnetic head.
Figure 2:
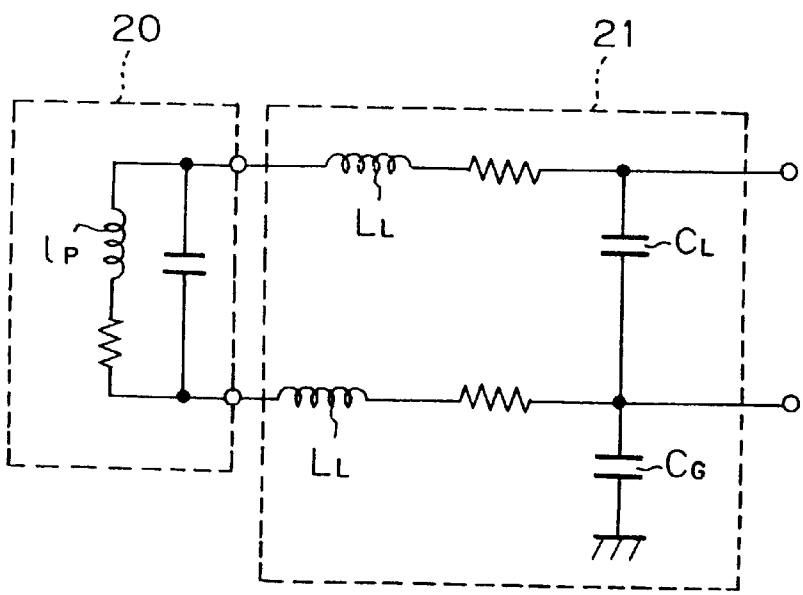
FIG. 2 shows the already described equivalent circuit of the reading head part of the prior art HGA provided with the integrated read/write magnetic head.
Figure 3:
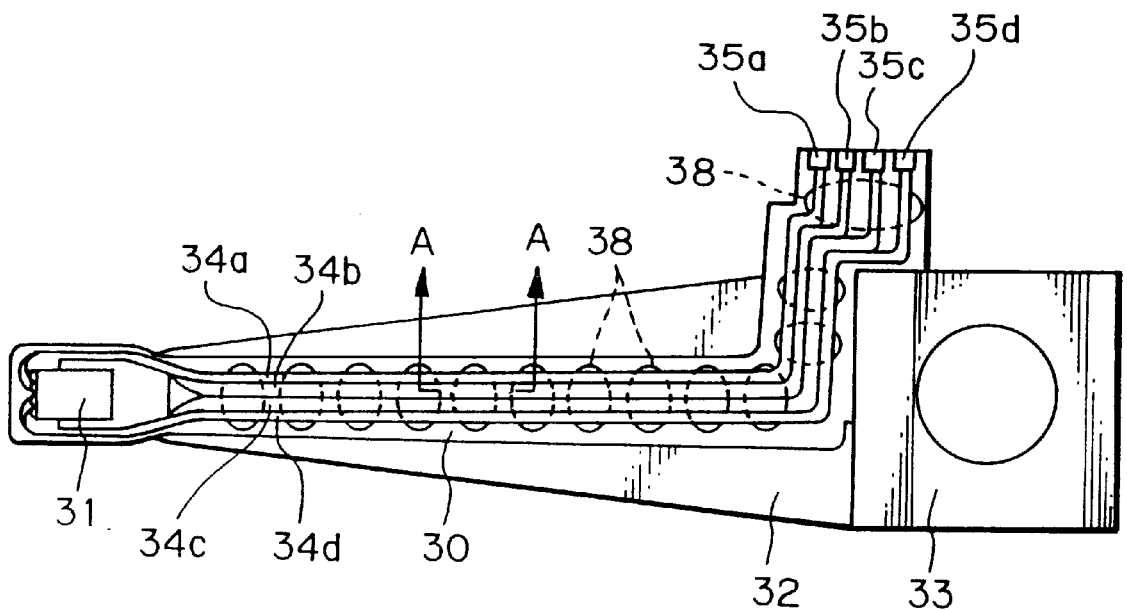
FIG. 3 shows a plane view of a preferred embodiment of a HGA according to the present invention.
Figure 4:
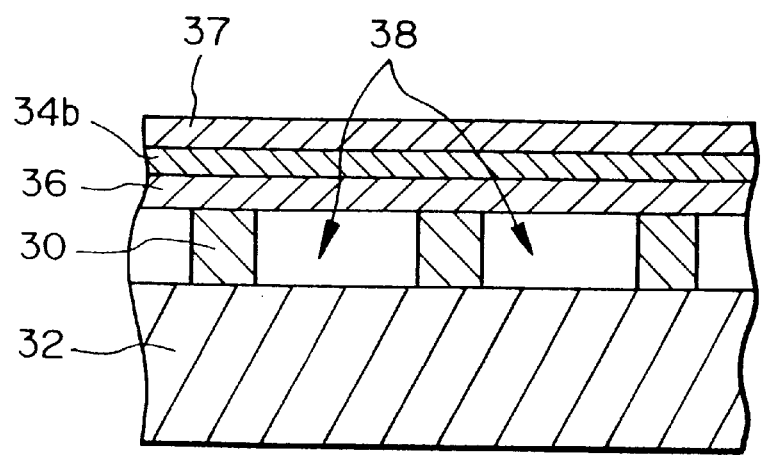
FIG. 4 is a sectional view along a A—A line of FIG. 3.

FIG. 3 shows a plane view of a preferred embodiment of a HGA according to the present invention, and FIG. 4 shows a sectional view along the A—A line of FIG. 3.

In these figures, reference numeral 30 denotes a resilient flexure for carrying a magnetic head slider 31 near its one end portion, 32 denotes a load beam for supporting and fixing the flexure 30, and 33 denotes a base plate fixed to a base end portion of the load beam 32, respectively.

The flexure 30 is made of in this embodiment a stainless steel plate (for example SUS304TA) with a thickness of about 25 µm. As for lead lines, four connection conductors 34a–34d of a thin film conductive pattern are formed on the flexure 30 along its whole length. One ends of the conductors 34a–34d are connected to four connection terminals formed by a thin film conductive pattern (not shown) and directly connected to the magnetic head slider 31, and the other ends of the conductors 34a–34d are connected to connection terminals 35a–35d formed by a thin film conductive pattern and connected to external circuits.

The thin film conductive pattern can be formed by a well known method similar to the patterning method of forming a printed circuit board on a thin metal plate. Namely, as shown in FIG. 4, the conductive pattern is formed by sequentially depositing a polyimide layer 36 with a thickness of about 5 µm (lower insulating material layer), a patterned Cu layer 34a–34d with a thickness of about 4 µm (conductors layer), and a polyimide layer 37 with a thickness of about 5 µm (upper insulating material layer) on the flexure 30 in this order. In a modification, a preliminarily deposited multi-layered film of the conductive pattern may be laminated on the flexure 30. Within the regions of the connection terminals (35a–35d), a Ni layer and an Au layer are sequentially deposited on the Cu layer and there is no upper insulating material layer. In order to easily understand the structure, the connection conductors 34a–34d are indicated by solid lines in FIG. 3.

The load beam 32 is made of in this embodiment a stainless steel plate with a thickness of about 62–76 µm and supports the flexure 30 along its whole length. Fixing of the flexure 30 to the load beam 32 is achieved by means of a plurality of welded spots such as laser welded spots.

The base plate 33 is made of a stainless steel or iron and is fixed to the base end portion of the load beam 32 by means of welded spots. In a modification, the base end portion of the flexure 30 may be constructed to function as a load beam instead of preparing and attaching the individual load beam 32.

The important configuration in this embodiment is that a plurality of ellipse shaped via holes 38 are formed to pass through the stainless steel plate of the flexure 30 by means of for example etching. These via holes 38 formed through the flexure 30 under the conductive pattern 34a–34d reduce effective area of the flexure 30 which operates as the opposed electrode of the conductive pattern 34a–34d. Thus, according to this configuration, the parasitic capacitance $C_G$ between the conductive pattern 34a–34d and the flexure 30 can be lowered. The metal load beam 32 positioned behind the flexure 30 may behave, in this embodiment, as the opposed electrode with respect to the conductive pattern 34a–34d at portions of the via holes 38 to increase the distance between the capacitor's electrodes causing the parasitic capacitance $C_G$ to lower. Furthermore, forming of the via holes 38 will reduce the weight of the flexure 30 resulting the mechanical resonance characteristics and also the dynamic oscillation characteristics of the whole metal suspension to improve.

Although each of the via holes 38 is shaped in ellipse in this embodiment, in modifications, it can be formed in any shape such as rectangle or another polygon. The shape and/or size of the via holes 38 may be the same or different with each other. Also, the size of the via holes 38 is not limited to that shown in FIG. 3. However, the via holes 38 should be made with satisfying the principal function of the flexure 30, namely with securing flexibility of the flexure 30 so as to allow the magnetic head slider 31 to freely move. Also, the via holes 38 should be formed at positions other than the welded fixing points with the load beam 32. In order to extremely lower the parasitic capacitance $C_G$, it is desired that all the metal portions of the flexure 30, which are unnecessary for achieving the principal operations of the flexure, should be removed by forming the via holes 38. If a half area of the flexure 30 is removed, the parasitic capacitance will be reduced to about 20 pF. The more reducing the area of the flexure, the more lowering the parasitic capacitance $C_G$.

By constructing the via holes 38 through the flexure 30, the lower insulating material layer 36, the conductive layer 34a–34d and the upper insulating material layer 37 laminated on the flexure 30 are bridged over these via holes. Therefore, in order to secure the sufficient strength, it is desired to form the insulating material layers 36 and 37 thicker and also the conductive layer 34a–34d thicker and wider as large as permitted.

Figure 5:
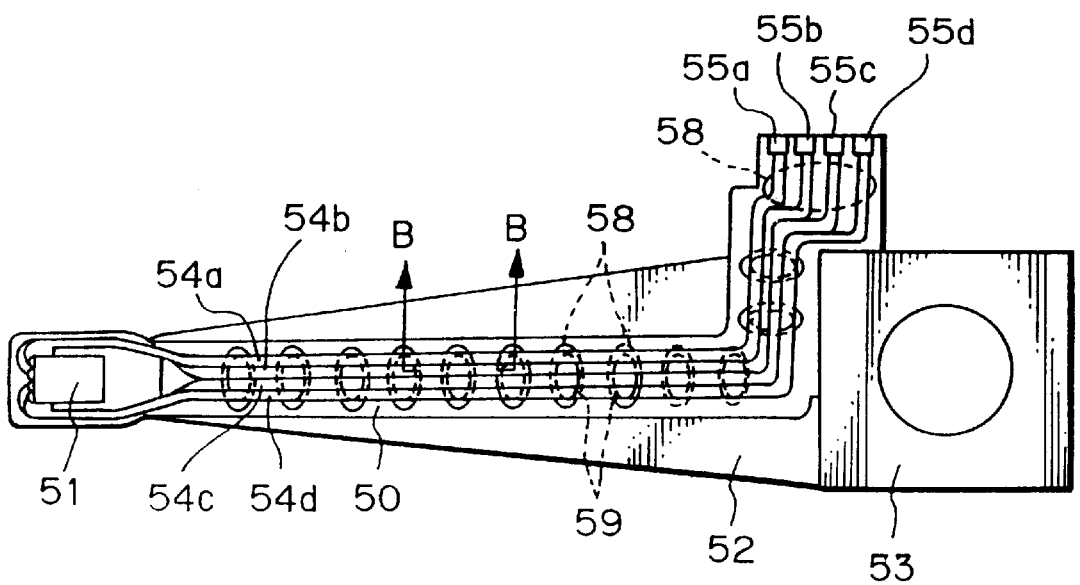
FIG. 5 shows a plane view of another embodiment of a HGA according to the present invention.
Figure 6:
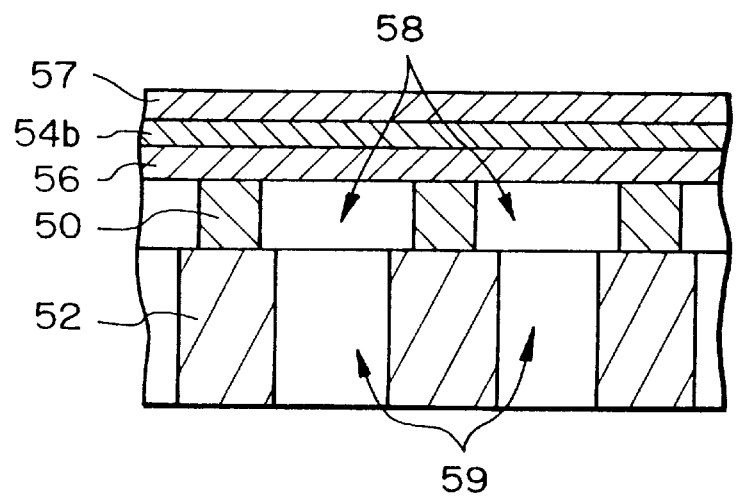
FIG. 6 is a sectional view along a B—B line of FIG. 5.

FIG. 5 shows a plane view of another embodiment of a HGA according to the present invention, and FIG. 6 shows a sectional view along the B—B line of FIG. 5.

In these figures, reference numeral 50 denotes a resilient flexure for carrying a magnetic head slider 51 near its one end portion, 52 denotes a load beam for supporting and fixing the flexure 50, and 53 denotes a base plate fixed to a base end portion of the load beam 52, respectively.

The flexure 50 is made of in this embodiment a stainless steel plate (for example SUS304TA) with a thickness of about 25 µm. As for lead lines, four connection conductors 54a–54d of a thin film conductive pattern are formed on the flexure 50 along its whole length. One ends of the conductors 54a–54d are connected to four connection terminals formed by a thin film conductive pattern (not shown) and directly connected to the magnetic head slider 51, and the other ends of the conductors 54a–54d are connected to connection terminals 55a–55d formed by a thin film conductive pattern and connected to external circuits.

The thin film conductive pattern can be formed by a well known method similar to the patterning method of forming a printed circuit board on a thin metal plate. Namely, as shown in FIG. 6, the conductive pattern is formed by sequentially depositing a polyimide layer 56 with a thickness of about 5 µm (lower insulating material layer), a patterned Cu layer 54a–54d with a thickness of about 4 µm (conductors layer), and a polyimide layer 57 with a thickness of about 5 µm (upper insulating material layer) on the flexure 50 in this order. In a modification, a preliminarily deposited multi-layered film of the conductive pattern may be laminated on the flexure 50. Within the regions of the connection terminals (55a–55d), a Ni layer and an Au layer are sequentially deposited on the Cu layer and there is no upper insulating material layer. In order to easily understand the structure, the connection conductors 54a–54d are indicated by solid lines in FIG. 5.

The load beam 52 is made of in this embodiment a stainless steel plate with a thickness of about 62–76 µm and supports the flexure 50 along its whole length. Fixing of the flexure 50 to the load beam 52 is achieved by means of a plurality of welded spots such as laser welded spots.

The base plate 53 is made of a stainless steel or iron and is fixed to the base end portion of the load beam 52 by means of welded spots. In a modification, the base end portion of the flexure 50 may be constructed to function as a load beam instead of preparing and attaching the individual load beam 52.

The important configuration in this embodiment is that a plurality of ellipse shaped via holes 58 are formed to pass through the stainless steel plate of the flexure 50 and also a plurality of ellipse shaped via holes 59 are formed through the load beam 52, by means of for example etching. These via holes 58 formed through the flexure 50 under the conductive pattern 54a–54d and the via holes 59 formed through the load beam 52 under the respective via holes 58 reduce effective areas of the flexure 50 and of the load beam 52 which operate as the opposed electrode of the conductive pattern 54a–54d. Thus, according to this configuration, the parasitic capacitance $C_G$ between the conductive pattern 54a–54d and the flexure 50 or the load beam 52 can be lowered. Furthermore, forming of the via holes 58 and 59 will reduce the weight of the flexure 50 and the load beam 52 resulting the mechanical resonance characteristics and also the dynamic oscillation characteristics of the whole metal suspension to improve.

Although each of the via holes 58 and 59 is shaped in ellipse in this embodiment, in modifications, it can be formed in any shape such as rectangle or another polygon. The shape of the via holes 58 and 59 may be the same or different with each other. In this embodiment, the size of the each via hole 58 is larger than that of the each via hole 59. However, they can be formed in the same size or different sizes. in some case, the size of the each via hole 58 may be smaller than that of the each via hole 59. Also, the sizes of the via holes 58 and 59 are not limited to that shown in FIG. 5. However, the via holes 58 should be made with satisfying the principal function of the flexure 50, namely with securing flexibility of the flexure 50 so as to allow the magnetic head slider 51 to freely move. Also, the via holes 58 should be formed at positions other than the welded fixing points with the load beam 52. In order to extremely lower the parasitic capacitance $C_G$, it is desired that all the metal portions of the flexure 50 and of the load beam 52, which are unnecessary for achieving the principal operations of the flexure, should be removed by forming the via holes 58 and 59. If half area of the flexure 50 and the load beam 52 is removed, the parasitic capacitance will be reduced to about 20 pF. The more reducing the area of the flexure and the load beam, the more lowering the parasitic capacitance $C_G$.

By constructing the via holes 58 through the flexure 50, the lower insulating material layer 56, the conductive layer 54a–54d and the upper insulating material layer 57 laminated on the flexure 50 are bridged over these via holes. Therefore, in order to secure the sufficient strength, it is desired to form the insulating material layers 56 and 57 thicker and also the conductive layer 54a–54d thicker and wider as large as permitted.

Figure 7:
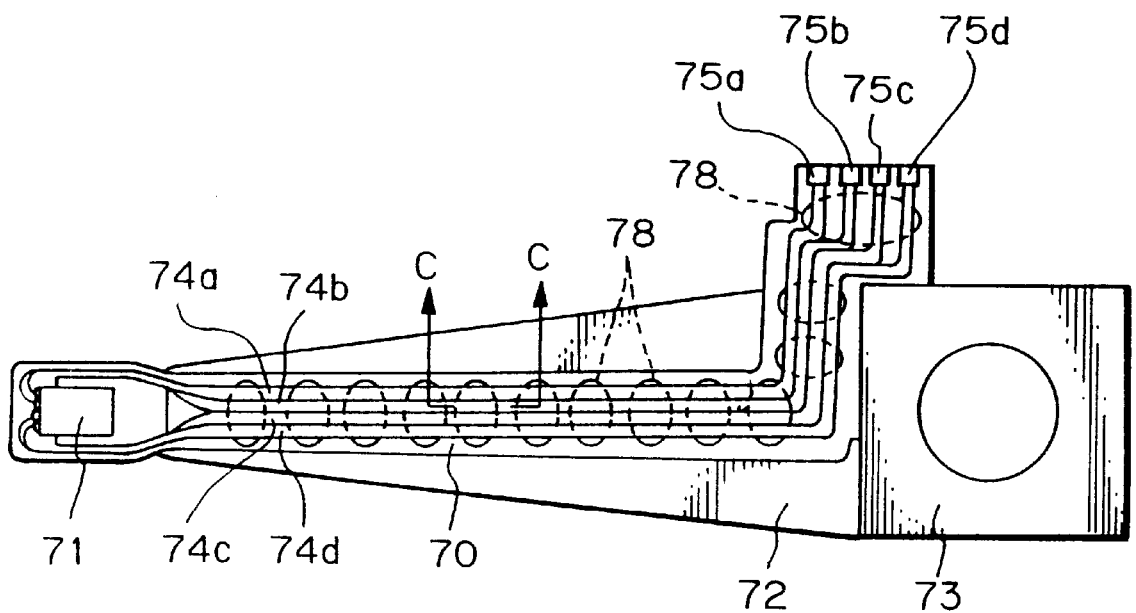
FIG. 7 shows a plane view of a further embodiment of a HGA according to the present invention.
Figure 8:
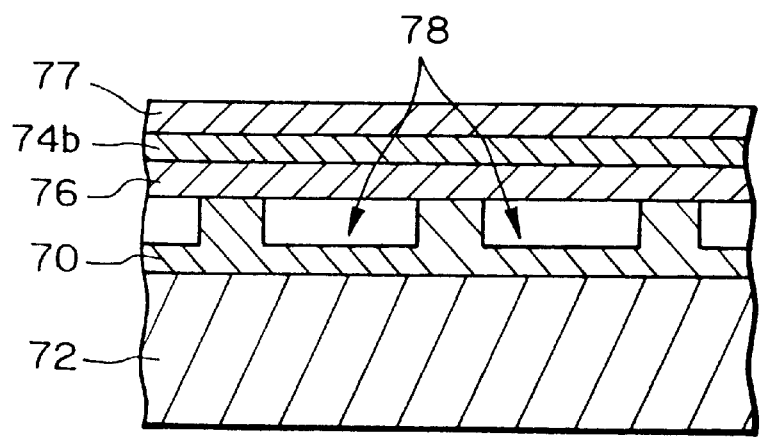
FIG. 8 is a sectional view along a C—C line of FIG. 7.

FIG. 7 shows a plane view of a further embodiment of a HGA according to the present invention, and FIG. 8 shows a sectional view along the C—C line of FIG. 7.

In these figures, reference numeral 70 denotes a resilient flexure for carrying a magnetic head slider 71 near its one end portion, 72 denotes a load beam for supporting and fixing the flexure 70, and 73 denotes a base plate fixed to a base end portion of the load beam 72, respectively.

The flexure 70 is made of in this embodiment a stainless steel plate (for example SUS304TA) with a thickness of about 25 $\mu$m. As for lead lines, four connection conductors 74a–74d of a thin film conductive pattern are formed on the flexure 70 along its whole length. One ends of the conductors 74a–74d are connected to four connection terminals formed by a thin film conductive pattern (not shown) and directly connected to the magnetic head slider 71, and the other ends of the conductors 74a–74d are connected to connection terminals 75a–75d formed by a thin film conductive pattern and connected to external circuits.

The thin film conductive pattern can be formed by a well known method similar to the patterning method of forming a printed circuit board on a thin metal plate. Namely, as shown in FIG. 8, a multi-layered film made of a polyimide layer 76 with a thickness of about 18 $\mu$m (lower insulating material layer) and a Cu layer with a thickness of about 18 $\mu$m (conductors layer) is laminated on the flexure 70, then the laminated Cu layer is patterned to have the conductors layer 74a–74d, and then a polyimide layer 77 with a thickness of about 5 $\mu$m (upper insulating material layer) is deposited on the Cu layer. Within the regions of the connection terminals (75a–75d), a Ni layer and an Au layer are sequentially deposited on the Cu layer and there is no upper insulating material layer. in order to easily understand the structure, the connection conductors 74a–74d are indicated by solid lines in FIG. 7.

The load beam 72 is made of in this embodiment a stainless steel plate with a thickness of about 62–76 $\mu$m and supports the flexure 70 along its whole length. Fixing of the flexure 70 to the load beam 72 is achieved by means of a plurality of welded spots such as laser welded spots.

The base plate 73 is made of a stainless steel or iron and is fixed to the base end portion of the load beam 72 by means of welded spots. In a modification, the base end portion of the flexure 70 may be constructed to function as a load beam instead of preparing and attaching the individual load beam 72.

The important configuration in this embodiment is that a plurality of ellipse shaped recesses (blind holes) 78 are formed on the stainless steel plate of the Flexure 70 by means of for example half etching. These recesses 78 formed on the flexure 70 under the conductive pattern 74a–74d increase the distance between the capacitor's electrodes which are constituted by the conductive pattern 74a–74d and the flexure 70, at portions of the recesses 78. Thus, according to this configuration, the parasitic capacitance $C_G$ between the conductive pattern 74a–74d and the flexure 70 can be lowered. Furthermore, forming of. the recesses 78 will reduce the weight of the flexure 70 resulting the mechanical resonance characteristics and also the dynamic oscillation characteristics of the whole metal suspension to improve.

Although each of the recesses 78 is shaped in ellipse in this embodiment, in modifications, it can be formed in any shape such as rectangle or another polygon. The shape and/or size of the recesses 78 may be the same or different with each other. Also, the size of the recesses 78 is not limited to that shown in FIG. 7. However, the recesses 78 should be made with satisfying the principal function of the flexure 70, namely with securing flexibility of the flexure 70 so as to allow the magnetic head slider 71 to freely move. Also, the recesses 78 should be formed at positions other than the welded fixing points with the load beam 72. In order to extremely lower the parasitic capacitance $C_G$, it is desired that the recesses 78 are formed over all the portions of the flexure 70, which are unnecessary for achieving the principal operations of the flexure.

By constructing the recesses 78 on the flexure 70, the lower insulating material layer 76, the conductive layer 74a–74d and the upper insulating material layer 77 laminated on the flexure 70 are bridged over these recesses. Therefore, in order to secure the sufficient strength, it is desired to form the insulating material layers 76 and 77 thicker and also the conductive layer 74a–74d thicker and wider as large as permitted.

Figure 9:
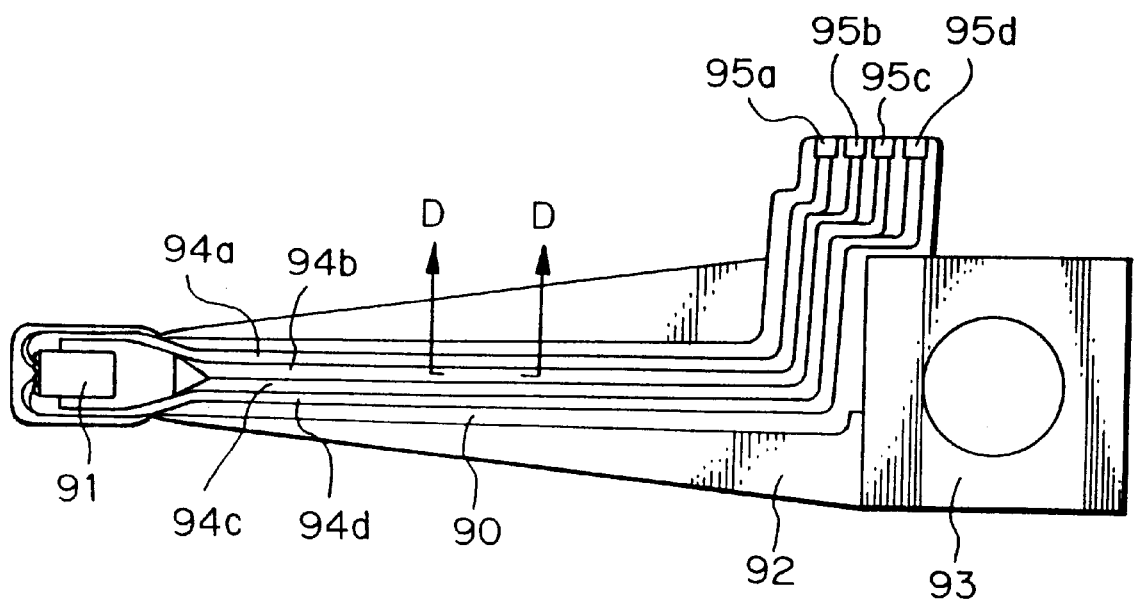
FIG. 9 shows a plane view of a still further embodiment of a HGA according to the present invention.
Figure 10:
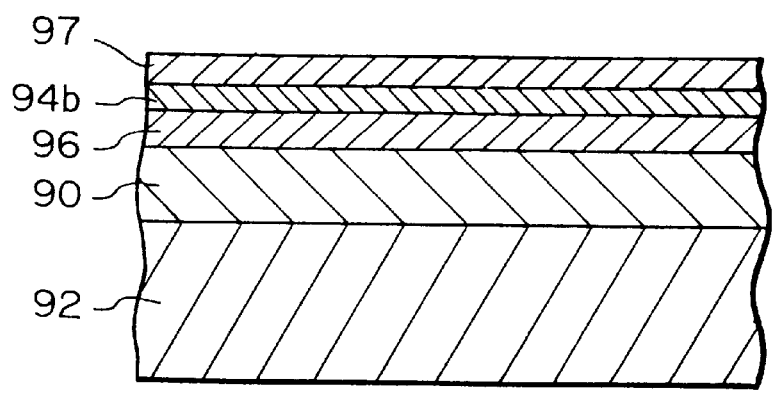
FIG. 10 is a sectional view along a D—D line of FIG. 9.

FIG. 9 shows a plane view of a still further embodiment of a HGA according to the present invention, and FIG. 10 shows a sectional view along the D—D line of FIG. 9.

In these figures, reference numeral 90 denotes a resilient flexure for carrying a magnetic head slider 91 near its one end portion, 92 denotes a load beam for supporting and fixing the flexure 90, and 93 denotes a base plate fixed to a base end portion of the load beam 92, respectively.

The flexure 90 is made of in this embodiment a stainless steel mesh plate with a thickness of about 25 μm. As for lead lines, four connection conductors 94a–94d of a thin film conductive pattern are formed on the flexure 90 along its whole length. One ends of the conductors 94a–94d are connected to four connection terminals formed by a thin film conductive pattern (not shown) and directly connected to the magnetic head slider 91, and the other ends of the conductors 94a–94d are connected to connection terminals 95a–95d formed by a thin film conductive pattern and connected to external circuits.

The thin film conductive pattern can be formed by a well known method similar to the patterning method of forming a printed circuit board on a thin metal plate. Namely, as shown in FIG. 10, the conductive pattern is formed by sequentially depositing a polyimide layer 96 with a thickness of about 5 μm (lower insulating material layer), a patterned Cu layer 94a–94d with a thickness of about 4 μm (conductors layer), and a polyimide layer 97 with a thickness of about 5 μm (upper insulating material layer) on the flexure 90 in this order. In a modification, a preliminarily deposited multi-layered film of the conductive pattern may be laminated on the flexure 90. Within the regions of the connection terminals (95a–95d), a Ni layer and an Au layer are sequentially deposited on the Cu layer and there is no upper insulating material layer. In order to easily understand the structure, the connection conductors 94a–34d are indicated by solid lines in FIG. 9.

The load beam 92 is made of in this embodiment a stainless steel plate with a thickness of about 62—76 μm and supports the flexure 90 along its whole length. Fixing of the flexure 90 to the load beam 92 is achieved by means of a plurality of welded spots such as laser welded spots.

The base plate 93 is made of a stainless steel or iron and is fixed to the base end portion of the load beam 92 by means of welded spots. In a modification, the base end portion of the flexure 90 may be constructed to function as a load beam instead of preparing and attaching the individual load beam 92.

Figure 11:
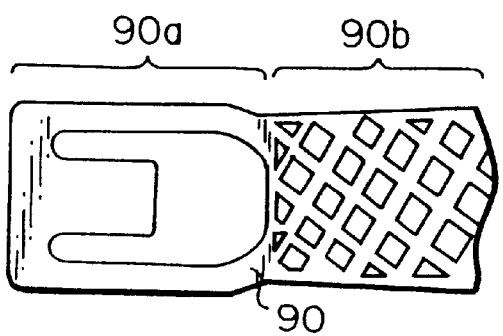
FIG. 11 a partial plane view of a flexure with no conductive pattern in the embodiment of FIG. 9.

As shown in FIG. 11 which indicating a partial plane view of the flexure 90 with no conductive pattern, the important configuration in this embodiment is that a portion 90b of the flexure 90 other than a portion 90a for carrying the magnetic head slider 91 is constituted by a mesh plane structure. This mesh structure reduces effective area of the flexure 90 which operates as the opposed electrode of the conductive pattern 94a–94d. Thus, according to this configuration, the parasitic capacitance $C_G$ between the conductive pattern 94a–94d and the flexure 90 can be lowered. Furthermore, forming in the mesh structure reduces the weight of the flexure 90 itself resulting the mechanical resonance characteristics and also the dynamic oscillation characteristics of the whole metal suspension to improve.

The above-mentioned mesh structure should be made with satisfying the principal function of the flexure 90, namely with securing flexibility of the flexure 90 so as to allow the magnetic head slider 91 to freely move.

Figure 12:
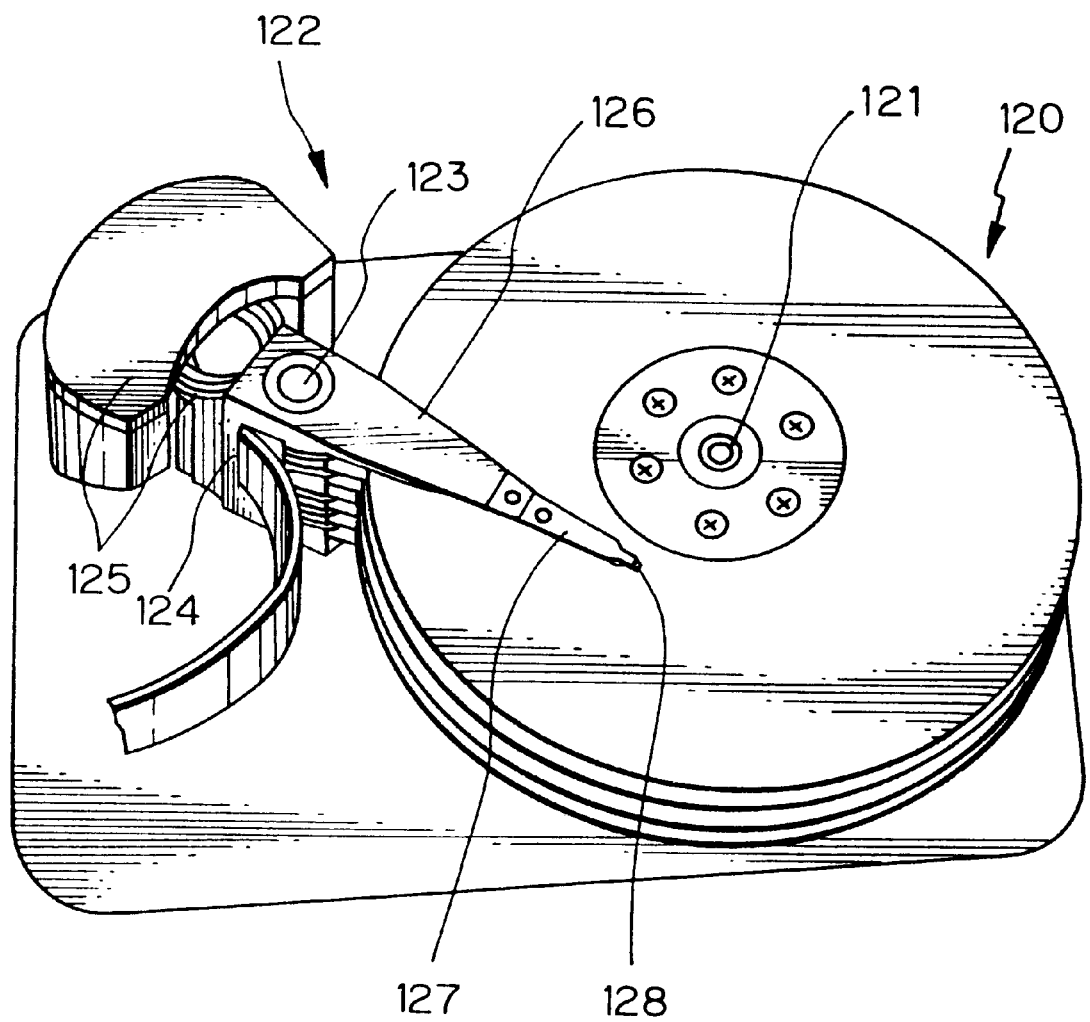
FIG. 12 shows an oblique view schematically illustrating a principal portion of an embodiment of a hard magnetic disk unit according to the present invention.

FIG. 12 schematically illustrates a principal portion of an embodiment of a hard magnetic disk unit according to the present invention. In the figure, reference numeral 120 denotes a plurality of magnetic disks rotating around an axis 121, and 122 denotes an assembly carriage device for positioning a magnetic head slider on a track of the disk. The assembly carriage device 122 is mainly constituted by a carriage 124 rotatable around an axis 123 and an actuator 125 such as for example a voice coil motor (VCM) for driving the carriage 124 to rotate.

Base portions at one ends of a plurality of drive arms 126 are attached to the carriage 124, and a plurality of HGAs 127 are mounted on top portions at the other ends of the arms 126, respectively. A magnetic head slider 128 is fixed to a top end portion of each of the HGAs 127 so as to oppose to the surface of the magnetic disk 120.

In this embodiment, only the drive arms 126 or both the drive arms 126 and the carriage 124 are made of nonconductive material such as plastic resin or ceramics. Thus, the HGAs 127 are electrically insulated from a grounded housing of the hard magnetic disk unit. In a modification, the drive arms 126 may be made of metal material whereas a bearing portion for receiving the axis 123 of the carriage 124 may be made of nonconductive material such as plastic resin or ceramics.

Figure 13:
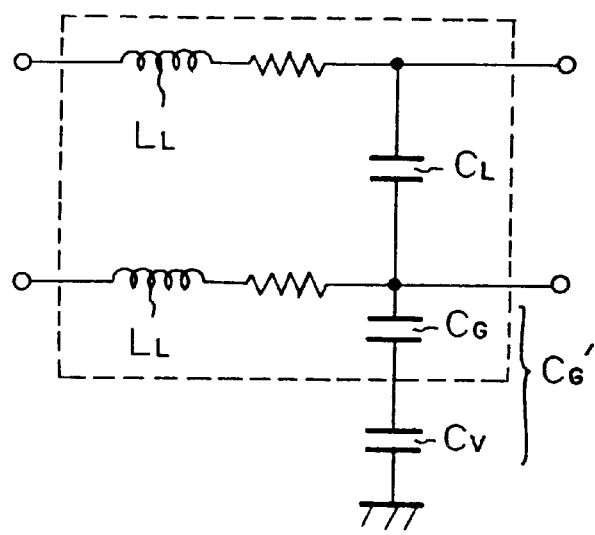
FIG. 13 shows an equivalent circuit of connection lead lines in the embodiment of FIG. 12.

FIG. 13 shows an equivalent circuit of the connection lead lines in the embodiment of FIG. 12. In the figure, a summed parasitic capacitance $C_G'$ is given by;

$$C_G' = C_G \times C_V / (C_G + C_V)$$

$$\cong 40 \times 5 / (40 + 5)$$

$$\cong 4.4 \, \text{pF},$$

where the parasitic capacitance $C_G$ is about 40 pF, and the minimum parasitic capacitance introduced by insulation of the HGA $C_V$, is about 5 pF. Since the HGAs are insulated for direct current from the grounded housing, the effective parasitic capacitance $C_G'$ between the lead lines and the ground will extremely lower.

Figure 14:
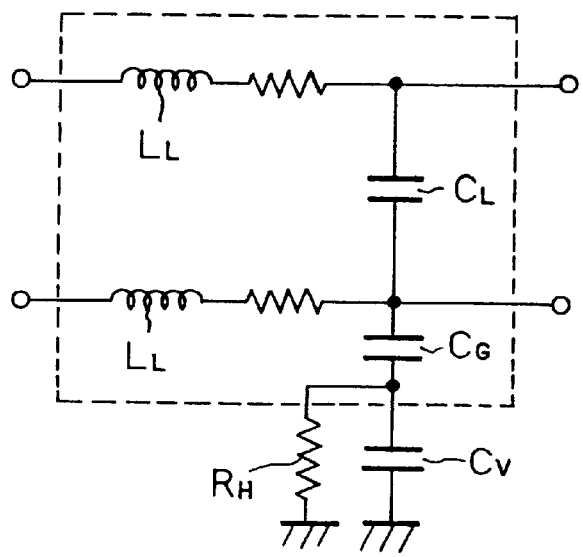
FIG. 14 shows an equivalent circuit of connection lead lines with a resistor having a high resistance value for preventing electrostatic problem.

However, if the HGAs are completely insulated for direct current from the ground, some troubles due to possibly produced electrostatic charge may occur. Thus, in practice, a resistor $R_H$ having a high resistance value for discharging the electrostatic charge is connected across the insulated HGA and the grounded housing as shown in an equivalent circuit of FIG. 14.

Figure 15:
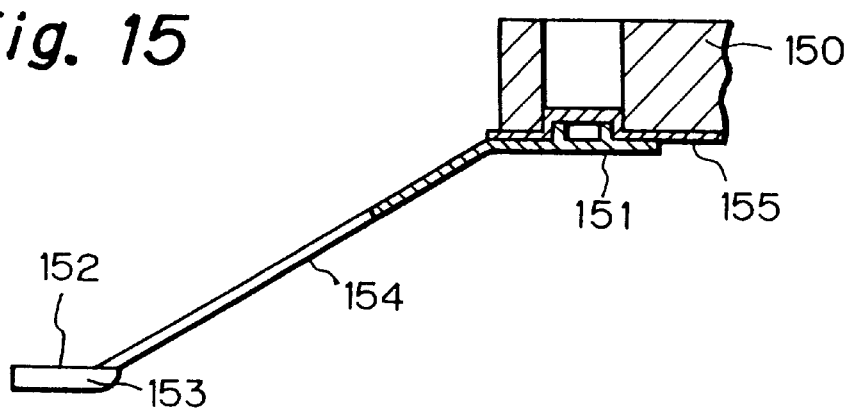
FIG. 15 shows a partially sectional view schematically illustrating a part of another embodiment of a hard magnetic disk unit according to the present invention.

FIG. 15 schematically illustrates a part of another embodiment of a hard magnetic disk unit according to the present invention. In the figure, reference numeral 150 denotes a drive arm attached to a carriage, 151 denotes a base plate of a HGA fixed to the drive arm 150, 152 denotes a resilient flexure of the HGA for carrying a magnetic head slider 153 near its one end portion, and 154 denotes a load beam of the HGA for supporting and fixing the flexure 152. The base end portion of the load beam 154 is fixed to the base plate 151.

In this embodiment, the base plate 151 of the HGA is fixed to the drive arm 150 via a member or a sheet 155 which is made of nonconductive material. Thus, the HGA is insulated for direct current from grounded housing of the hard magnetic disk unit, and therefore the effective parasitic capacitance $C_G'$ between the lead lines and the ground will extremely lower.

However, if the HGA is completely insulated for direct current from the ground, some troubles due to possible produced electrostatic charge may occur. Thus, in practice, resistors $R_H$ having a high resistance value for discharging the electrostatic charge are connected across the insulated HGA and the grounded housing as shown in an equivalent circuit of FIG. 14.

Many widely different embodiments of the present invention may be constructed without departing from the spirit and scope of the present invention. It should be understood that the present invention is not limited to the specific embodiments described in the specification, except as defined in the appended claims.

What is claimed is:

1. A hard magnetic disk unit comprising:

a plurality of head gimbal assemblies each of which has a magnetic head slider, a metal suspension for supporting said magnetic head slider, and insulating material layer formed on said metal suspension, and a conductive pattern of lead lines electrically connected with the magnetic head, said conductive pattern being formed on said insulating material layer;

arm portions for supporting said respective head gimbal assemblies;

an actuator for moving said arm portions to position the magnetic head sliders; and resistors having a high resistance value for discharging electrostatic charge, said head gimbal assemblies being electrically insulated from a ground so as to reduce effective parasitic capacitance between said lead lines and the ground, and said resistors being connected between said head gimbal assemblies and the ground, respectively.

2. The unit as claimed in claim 1, wherein said arm portions are made of nonconductive material.

3. The unit as claimed in claim 1, wherein coupling parts between said arm portions and said actuator are made of nonconductive material.

4. The unit as claimed in claim 1, wherein members made of nonconductive material are inserted between said head gimbal assemblies and said arm portions, respectively.

* * * * *